(12) United States Patent  
Scranton

(10) Patent No.: US 7,106,050 B1
(45) Date of Patent: Sep. 12, 2006

(54) APPARATUS FOR SHIELDING A DEVICE UNDER TEST FROM ELECTROMAGNETIC WAVES

(75) Inventor: Timothy Scranton, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/280,427

(22) Filed: Nov. 17, 2005

Related U.S. Application Data

(60) Provisional application No. 60/688,391, filed on Jun. 8, 2005.

(51) Int. Cl.
*G01R 31/02* (2006.01)
*H05K 9/00* (2006.01)

(52) U.S. Cl. ............... 324/158.1; 324/755; 361/816; 361/818

(58) Field of Classification Search .................. None
See application file for complete search history.

(56) References Cited

U.S. PATENT DOCUMENTS 5,880,930 A * 3/1999 Wheaton .................... 361/690
6,483,719 B1 * 11/2002 Bachman .................... 361/816
7,012,189 B1 * 3/2006 Kriege et al. .......... 174/35 GC

* cited by examiner

*Primary Examiner*—Minh N. Tang
(74) *Attorney, Agent, or Firm*—Sterne, Kessler, Goldstein & Fox P.L.L.C.

(57) ABSTRACT

A shielding apparatus was developed to eliminate electromagnetic waves interference (EMI) to an integrated circuit (IC) die while it is under test. The shielding apparatus comprises a conductive plate having a first and second surfaces and a central opening where the IC device is placed. The first surface includes a first EMI gasketed channel and a central cavity disposed inside of the gasketed channel. The second surface of the apparatus includes a second EMI gasketed channel and the central opening which extends through both the first and second surfaces. When the first surface mates with the surface of automatic test equipments (ATE) interface board, the first gasketed channel forms a tight seal. Similarly, when a plunger from a device handler mates with the second surface, the second EMI gasketed channel forms a seal that blocks out EMI. In this way, the IC device in the central opening of the apparatus is isolated from external EMI.

19 Claims, 5 Drawing Sheets

APPARATUS FOR SHIELDING A DEVICE UNDER TEST FROM ELECTROMAGNETIC WAVES

CROSS REFERENCE TO RELATED APPLICATIONS

This application claims the benefit of U.S. Provisional Application No. 60/688,391 filed Jun. 8, 2005, which is incorporated herein by reference in its entirety.

BACKGROUND OF THE INVENTION

1. Field of the Invention

The present invention relates to a shield developed to eliminate electromagnetic waves interference while testing radio frequency (RF) based products, specifically bit error rate (BER) failures on Bluetooth devices and gain measurement error on wireless local area network (WLAN) products caused by nearby WLAN access points and other transceivers.

2. Introduction

One of the last steps in the manufacturing process of a semiconductor device or an integrated circuit is the quality assurance (QA) process. In the QA process, automatic test equipment (ATE) is used to automatically test the device (device under test or DUT). During this QA process, the ATE applies test signals to the DUT and checks for appropriate responses. Based on the DUT's responses, the ATE marks the DUT as pass or fail by comparing the responses to predetermined signal response patterns. The appropriate response patterns are determined by the type of test employed and the type of product being tested.

DUTs that fail the initial QA process are typically fed through the ATE again to minimize false rejections. Once the DUT fails the second time, it is usually scrapped which will negatively affect production efficiency, cost, and profits. However, not all DUTs scrapped are bad. Variability factors in the test method, equipment, and environment plays an essential role in testing accuracy of the DUT. Minimizing these variability factors will lead to better testing process and higher production yield. The present invention focuses on the minimization of the variability in the test environment.

Device under test (DUT) are often sensitive to electromagnetic interference, particularly at high frequencies. Proper shielding of a DUT is therefore essential because of potential interference and the effect on the test's accuracy. In an un-shielded and high interference environment, many DUTs could be falsely rejected because of measurement errors that can be attributed to electromagnetic interference. Reducing this type of interference can be done in two ways. The first way is to eliminate the source of the interference. The second is to shield the DUT.

Surprisingly, it can be very difficult to eliminate the source of the high frequency that causes the interference. High frequency devices are abundant. Often time these devices are located in the same environment with the DUT such as switched mode power supplies, computer clocks, laptops, mobile phones, and nearby WLAN access points.

Shielding is the second way to reduce electromagnetic interferences. One option is to shield the test room or the test area in which the DUT are being tested; however, this is a prohibitively expensive solution. The other option is to shield the ATE system. This option is also not viable, because ATE system is typically very large.

Generally, a compact shielding solution can be developed for an ATE. But there are few, if any, shielding solutions available on the market. Test equipment and socket vendors want to customize and integrate a shielding into their socket base but are not doing so due to high cost which in turn makes the test equipment not very marketable. Moreover, any of these solutions would be specific to that manufacturer and that socket footprint, which is not scalable.

Accordingly, what is needed is a low cost testing device that is capable of significantly attenuating interfering signals to a level below the sensitivity of the device under test (DUT).

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described. An embodiment of the present invention is now described. While specific methods and configurations are discussed, it should be understood that this is done for illustration purposes only. A person skilled in the art will recognize that other configurations and procedures may be used without departing from the spirit and scope of the invention.

A shielding device was developed to eliminate electromagnetic waves interference while testing RF products operating in the 2.4 GHz and 5 Ghz industrial, scientific, and medical (ISM) frequency bands. The invention is not limited to the specific frequencies mentioned herein, and can be applied to other frequencies as will be understood by those skilled in the arts. Specific problems that were addressed include bit error rate (BER) failures on Bluetooth devices caused by access points and laptops transceivers operating on nearby 802.1 μg WLAN. Similar problems were also detected while testing receiver gain on 802.11g WLAN parts.

Further features and advantages of the present invention, as well as the structure and operation of various embodiments of the present invention, are described in detail below with reference to the accompanying drawings.

Figure 1A:
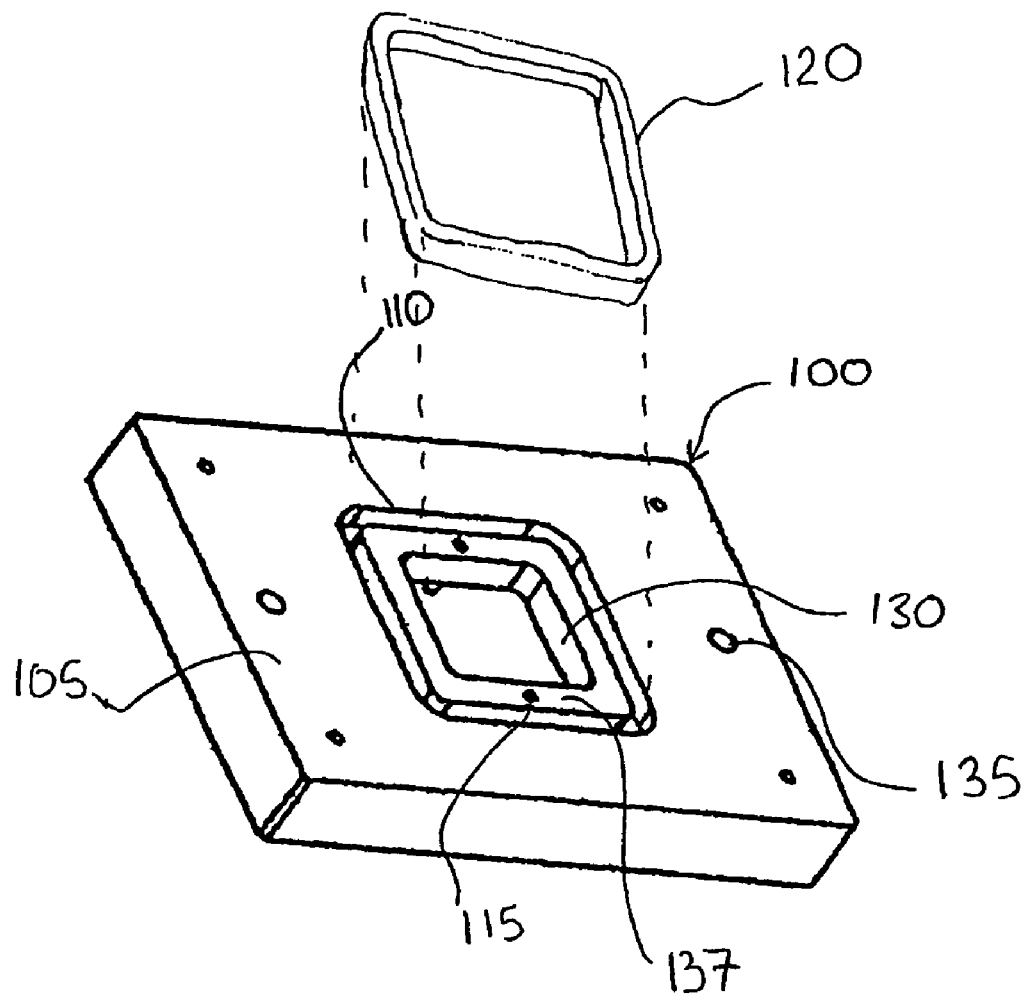
FIG. 1A illustrates an isometric top-view of a shielding device according to an embodiment of the present invention.

FIG. 1A illustrates a shielding device 100. Shielding device 100 is made with conductive metals such as copper, aluminum, stainless steel, or nickel-plated aluminum. The type of metal or plated-metal selected to fabricate shielding device 100 is based on several factors such as electromagnetic waves attenuating capability, ease of metal processing, and cost. In an embodiment, device 100 is made of stainless steel. Other suitable metals could also be used to fabricate shielding device 100 as will be understood by one skilled in the art. Shielding device 100 includes a mating surface 105, a channel 110, at least one alignment pin 115, a electromagnetic interference (EMI) gasket 120, and an opening 130.

Figure 4:
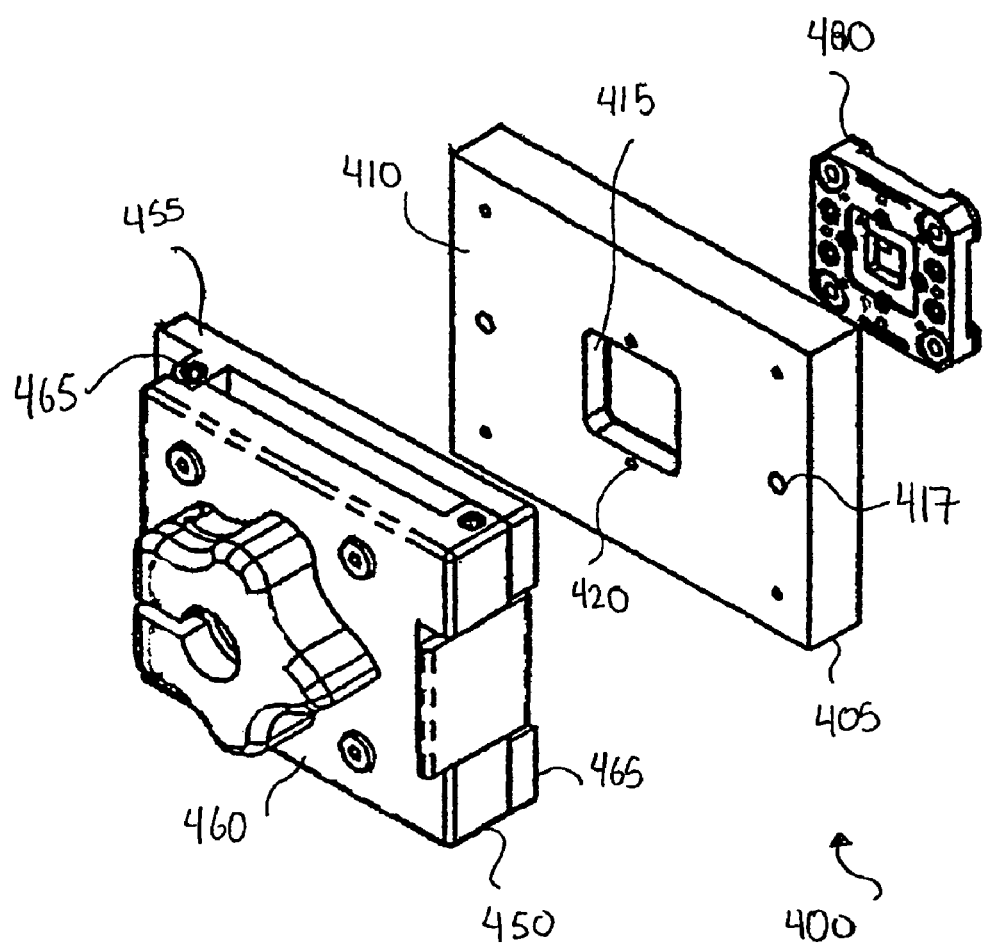
FIG. 4 illustrates an exploded view of the shielding device assembly according to an embodiment of the present invention.

Mating surface 105 mates with a corresponding surface of a shield lid in the final assembly of an embodiment of the shielding device. For example, FIG. 4 illustrates a lid 450, which will be discussed in detail herein. In an alternative embodiment, surface 105 mates with a surface of a plunger of a device handler. The shield lid and the plunger are preferably made of the same material as shielding device 100. In a metal to metal contact, there are always tiny gaps between the two mating surfaces. These gaps provide a conduit for electromagnetic waves to enter into the internal area of the shielding device 100. A way to eliminate these rogue electromagnetic waves is to provide an EMI gasket 120 between the two metal mating surfaces.

EMI gasket 120 is disposed inside of channel 110. The EMI gasket 120 is configured such that it fits inside channel 110, but also with adequate room for expansion due to compression. EMI gasket 120 is also configured such that when the shield lid (not shown) mates surface 105, gasket 120 compresses and creates a tight seal that would effectively block out electromagnetic waves. The EMI gasket 120 is preferably made with material that can withstand many compression cycles (compressive durability) such as a silicon sponge type gasket fortified with vertical wire. Other type of gaskets could also be used such as elastomer or foam gasket as long as the gasket has high shielding effectiveness (100 dB from 100 MHz to 10 GHz) and high compressive durability. For example, EMI gasket 120 can be an Elastofoam® gasket made by Tecknit Corporation of New Jersey. A brochure of available Elastofoam® gaskets is available at http://www.tecknit.com. The Elastofoam® gasket consists of scores of individual fine wires embedded and bonded in a soft closed cell silicone sponge elastomer. In an embodiment, the Elastofoam® gasket with Tecknit part No. 88-12057 is used. The invention is not limited to the EMI gasket described herein, other suitable type of gaskets could be used as long as there is proper compressive durability and electromagnetic waves attenuation.

Further, shielding device 100 includes at least one alignment pin 115. Alignment pin 115 is used to align shielding device 100 with a test interface (not shown) which is aligned to a test board that eventually goes onto a test bed (also not shown) of an ATE for testing. Alignment between these various components is critical, especially during production where millions of devices are precisely positioned in the test sockets by device handlers. Normally, shielding device 100 has to be manufactured to certain specification in order for proper mating with the test socket. This task itself is usually not an issue; however, the design of the test socket varies by the type of ATE machine, products, and manufacturers. Therefore, it becomes impractical to fabricate various versions of shielding device 100 to accommodate all of the different test socket footprint designs. To overcome this problem, two alignment pins 115 are provided on shielding device 100. Alignment pins 115 can be used to properly align shielding device 100 to the test socket of the test board or bed of various type of ATEs. As shown in FIG. 1A, pins 115 are flushed with a surface 137 of device 100. Pins 115 extend beyond the surface opposing (not shown) surface 137. In this way, proper alignment may be provided. Additionally, alignment hole 135 could also be used to align a shielding lid or plunger (not shown) of a device handler. Shielding device 100 also includes an opening 130 to accommodate for an integrated circuit die, a circuit board, a semiconductor device, or any electrical device under test.

Figure 1B:
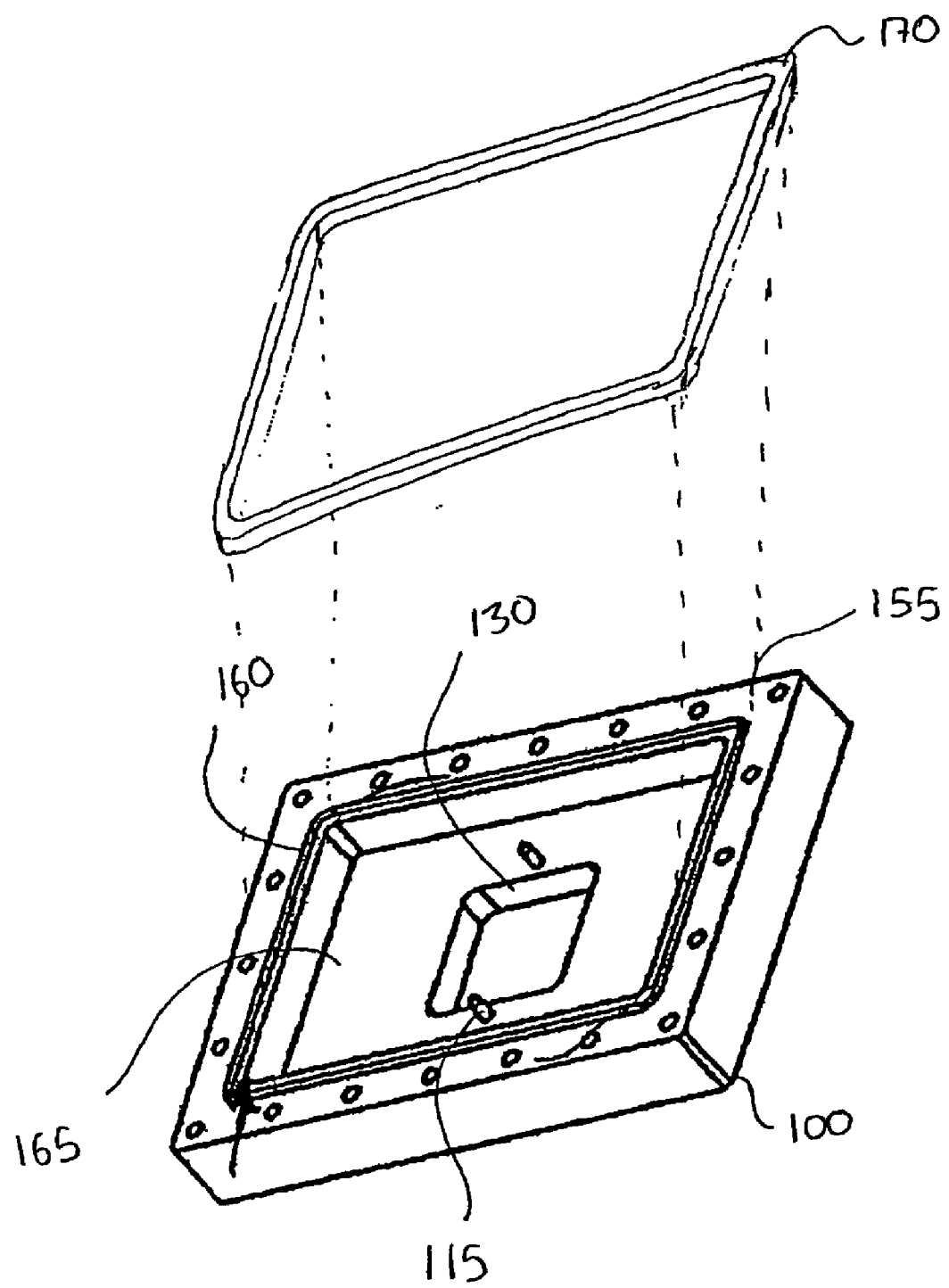
FIG. 1B illustrates an isometric bottom-view of a shielding device according to an embodiment of the present invention.

FIG. 1B illustrates the same shielding device 100 as shown in FIG. 1A but from a bottom view. Although device 100 as shown has a general rectangular shape, device 100 could take the form of any other shapes such as a circle, a square, or even a triangle. In an embodiment, shielding device 100 includes a mating surface 155, a channel 160, a cavity or slot 165, a gasket 170, and an opening 130. Mating surface 155 mates with a corresponding surface of a test board of an ATE (not shown). Again, a gasket is needed between two contacting metal surfaces to effectively block out electromagnetic waves interference.

In an embodiment, a channel 160 is provided along the circumference of device 100. Channel 160 completely encloses cavity 165 in which a DUT rests (not shown). Further, gasket 170 is disposed inside of channel 160 to provide for a tight seal and to protect the DUT located inside of cavity 165. Gasket 170 is made from an foam or elastomer gasketing materials such as silver plated copper in silicone. Other suitable materials could also be used as long as it provides for attenuation of high frequency electromagnetic waves (120 dB at 10 GHz) and tight seal between two contacting metal surfaces. For example, gasket 170 is a Cho-Seal® conductive elastomer made by Chomerics, an entity of Parker Hannifin Corporation of Massachusetts. A brochure of available Cho-Seal® conductive elastomers is available at http://www.chomerics.com. In an embodiment, Cho-Seal® gasket with Chomerics part No. 10-05-1362-1215 is used. Although certain frequencies are recited as guideline for selecting a suitable gasket, the invention is not limited to the specific frequencies mentioned herein, and can be applied to other frequencies as will be understood by those skilled in the arts.

Further, cavity 165 may take any shape and size as long as it is completely enclosed by channel 160. Cavity 165 is configured such that its size will accommodate for various IC device's size and geometry. The depth of cavity 165 is designed such that there is a minimum clearance of one tenth of an inch (0.1") between the base of the cavity (or roof of the shield) to any components or circuit board traces under the shield. In this way, the shield does not interfere with the operation of any microstrip traces or high frequency components such as capacitors, inductors, etc.

Shielding device 100 eliminates the need for the test socket vendor to integrate shielding solution into their socket body. There are some dimensional restrictions that the test socket must be designed to in order to accommodate shielding device 100. However, specifying height, width, and length of test sockets is every day practice in the industry. The only added requirement of the socket vendor is that their lid must mount to shielding device 100 instead of the test board or the test socket, and their plunger must accommodate the added plunge depth due to the height of shielding device 100. Additionally, the socket vendor must configure their plunger to seal against the gasketed perimeter created by channel 110 and gasket 120. But this is not burdensome to the test socket vendor because every socket must be designed to accommodate for the height of the DUT package and the plunger design is an ordinary step of the socket design process.

In one embodiment, shielding device 100 has an outer dimension of 78 mm×58 mm, designed to accommodate standard 2×2 configuration on most device handlers (80 mm centers X, 60 mm centers Y) so quad site testing can be performed. Nominal test socket dimensions support DUT's up to 12 mm×12 mm in size, which incorporates current RF, WLAN, and Bluetooth solutions. However, tradeoffs in area under the shield can be made for even larger devices while maintaining the same 78 mm×58 mm footprint. For larger VLSI devices, the dimensions can be scaled. The present invention is not limited to the dimensions described herein. Other dimensions could be used for the electromagnetic waves shield, as will be understood by those skilled in the arts.

Figure 2:
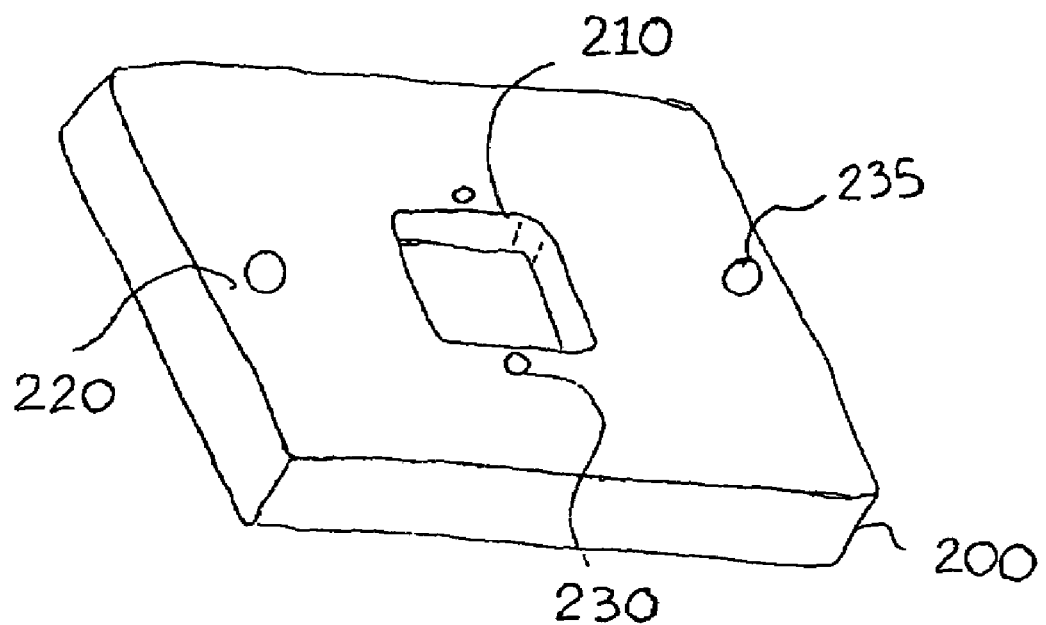
FIG. 2 illustrates an isometric view of a shielding device according to an embodiment of the invention.

FIG. 2 illustrates a top isometric view of an alternative embodiment of shielding device. The shielding device 200 includes an opening 210, a surface 220, alignment hole 235, and at least one alignment pin 230. In an embodiment, shielding device 200 includes two alignment pins 230. Noticeably missing from device 200 is a channel and a gasket on surface 220. In an alternative embodiment, these two features are located in the respective lid or plunger as will be described herein. Although not shown, shielding device 200 has the exact same features of shielding device 100 from the bottom view, see FIG. 1B. In an yet another embodiment, shielding device 200 incorporates every features of shielding device 100, as shown in FIG. 1B, except for channel 160 and gasket 170. In this embodiment, the gasket and channel assembly would be part the ATE interface board.

Figure 3:
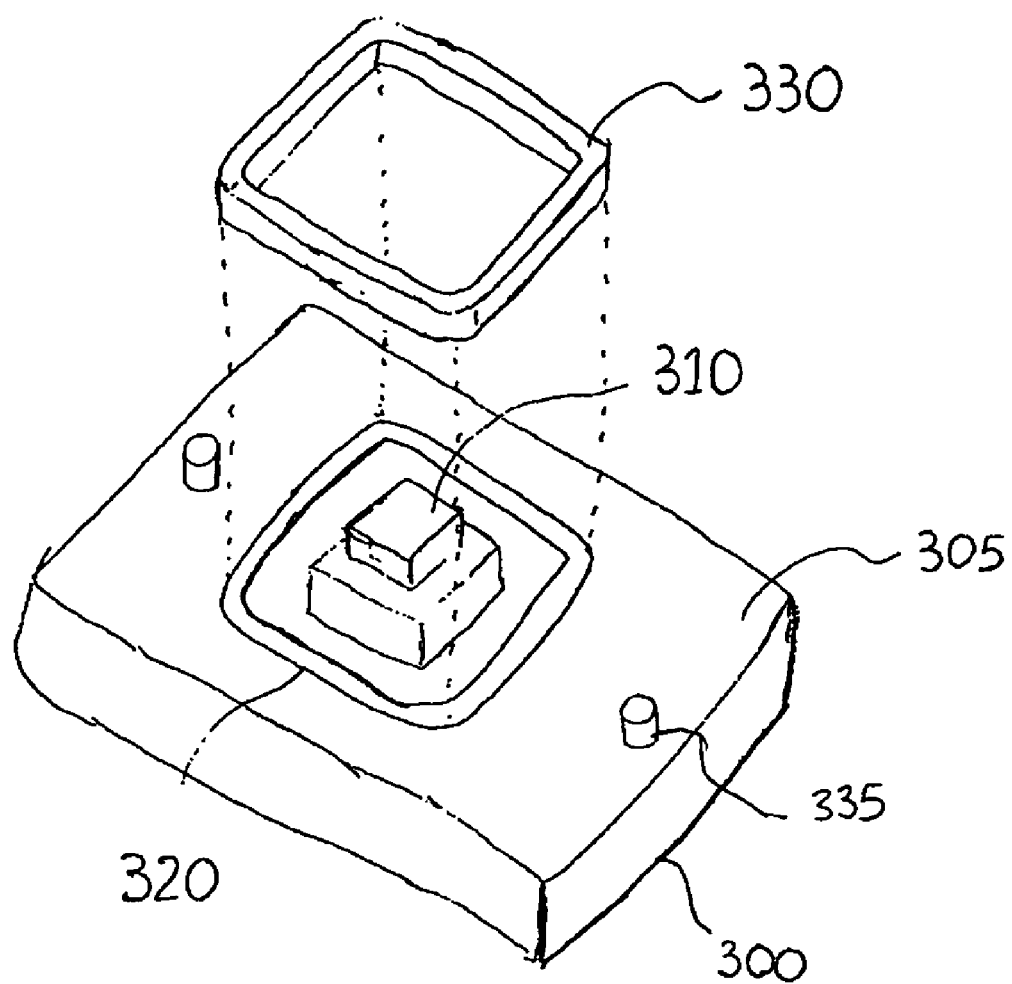
FIG. 3 illustrates an isometric top-view of a shielding lid according to an embodiment of the present invention.

FIG. 3 illustrates a lid or plunger 300. Lid 300 includes a surface 305, a protrusion 310, a channel 320, a gasket 330, and alignment pin 335. Surface 305 is configured to mate with opposing surface 220 on device 200. Alignment pin 335 is configured to align and mate with alignment hole 235 on device 200. When the two surfaces mate, gasket 330 compresses and creates a tight seal along channel 320. Channel 320 is configured to hold gasket 330 in place but also to give gasket 330 sufficient space for expansion due to the compression that occurred during the mating process. Further, lid 300 includes a protrusion 310 which may or may not exhibit a step-like feature. The protrusion 310 is configured to fit in opening 210. The height of protrusion 310 is also configured to account for the size and height of the DUT and also for the size and height of shielding device 200. In an embodiment, the lid 300 is a plunger configured to pick and place an IC device into opening 210 for testing. This could be accomplished using mechanical means or suction means. Additionally, the plunger serves as a lid that once mated with surface 220 on device 200 provides a shielding enclosure for the IC device from external electromagnetic waves interference.

FIG. 4 illustrates an exploded view of a shielding device assembly 400 according to an embodiment of the present invention. Assembly 400 is designed for manual testing of an IC device. Assembly 400 includes a shielding device 405, a lid and plunger assembly 450, and a test interface 480. Shielding device 405 comprises a surface 410, alignment hole 417, alignment pin 420, and an opening 415. Shielding device 405 further includes all of the features of shielding device 200 as shown on FIG. 2. The lid/plunger assembly 450 comprises a lid/plunger base 455 and a lid 460. In lid 460, the side not shown (opposite side) incorporates all of the features of plunger 300, including the channel 320 and the gasket 330.

In assembly 400, surface 410 is mated with surface 465. During the mating process, alignment holes 417 could be used to properly guide the lid/plunger assembly 450 into place. Once the two pieces are mated, the gasket on surface 305 tightly seals the assembly and blocks electromagnetic interference from reaching opening 415 where test interface 480 rests. Further, shielding device 405 is aligned to a test socket using pin 420 and is gasketed against a test board surface (not shown) to create a tight seal. The test interface 480 that rests in opening 415 can be accessed using lid 460 which opens up at pivot points 465. In an embodiment, a plunger of a device handler could be configured to pick and place an IC device (not shown) into opening 415 and onto test interface 480 for testing. The plunger may be configured to pick and place IC device with mechanical means or suction means. Additionally, the plunger serves as a lid that once mated with the surface 410 on device 405 provides a shielding enclosure for the IC device and the test interface 480 from external electromagnetic waves interference. Further, the plunger may incorporate all of the features of plunger 300, including channel 320 and gasket 330.

In an alternative embodiment, assembly 400 uses shielding device 100 in place of shielding device 200. Further, lid 460 incorporates all of the features of plunger 300 except for channel 320 and gasket 330. In yet another embodiment, a plunger that is part of a device handler could be used with shielding device 100. Further, the plunger may incorporate all of the features of plunger 300 except for channel 320 and gasket 330.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A shielding apparatus to shield an integrated circuit (IC) device from electromagnetic waves comprising:
   a conductive plate having a first surface and a second opposing surface, the first surface including
   a first channel on the first surface that encloses an inner region of the first surface;
   a cavity on the inner region of the first surface having a cavity depth that extends between the first and second surface;
   a first gasket disposed inside the first channel, wherein the first gasket is configured to create a tight seal when the first gasket comes into contact with another surface;
   an opening for the IC device on the cavity that extends between the first and second surface;
   wherein the second opposing surface includes
   a second channel on the second surface that encloses the opening, wherein the second channel has a depth that extends between the second surface and the cavity depth;

a second gasket disposed inside the second channel, wherein the second gasket is configured to create a tight seal when the second gasket comes into contact with another surface.

2. The apparatus of claim 1, wherein the first gasket is an elastomeric gasket or an EMI gasket.

3. The apparatus of claim 1, wherein the second gasket is an EMI gasket.

4. The apparatus of claim 1, wherein the conductive plate is aluminum.

5. The apparatus of claim 1, wherein the conductive plate is copper.

6. The apparatus of claim 1, wherein the conductive plate is stainless steel.

7. The apparatus of claim 1 further comprising:
at least one alignment pin on the second surface between the opening and the second channel.

8. The apparatus of claim 1 further comprising:
a lid that is configured to mate with the second gasket, the lid comprises:
  a conductive portion having a surface, wherein the surface mates with the second gasket to create a tight seal;
  a protrusion on the surface of the conductive portion, wherein the protrusion is configured to fit inside of the opening of the conductive plate.

9. The apparatus of claim 8, wherein the conductive portion comprises aluminum.

10. The apparatus of claim 8, wherein the conductive portion comprises copper.

11. The apparatus of claim 8, wherein the conductive portion comprises stainless steel.

12. The apparatus of claim 8, wherein the protrusion is configured to deliver the IC device into the opening.

13. An apparatus to shield an integrated circuit (IC) die from electromagnetic waves comprising:
a conductive plate having a first surface and a second opposing surface, the first surface comprising:
  a first channel on the first surface that encloses an inner region of the first surface;
  a cavity on the inner region of the first surface having a cavity depth that extends between the first and second surface;
  an opening for the IC device on the cavity that extends between the first and second surface;
a first gasket disposed inside the first channel, wherein the first gasket is configured to create a tight seal when the first gasket comes into contact with a surface of an instrument;
a lid that is configured to mate with the second surface, the lid comprises:
  a conductive portion having a third surface,
  a second channel on the third surface;
  a second gasket disposed inside the second channel, wherein the second gasket is configured to create a tight seal when the second gasket comes into contact with the second surface;
  a protrusion on the third surface that is configured to fit inside of the opening of the conductive plate.

14. The apparatus of claim 13, wherein the first gasket is an elastomeric gasket or an EMI gasket.

15. The apparatus of claim 13, wherein the second gasket is an EMI gasket.

16. The apparatus of claim 13, wherein the conductive plate is made with aluminum.

17. The apparatus of claim 13, wherein the conductive portion is made with copper.

18. The apparatus of claim 13, wherein the conductive portion is made with stainless steel.

19. The apparatus of claim 13 further comprising:
at least one alignment pin on the second surface.

* * * * *